United States Patent
Hsieh et al.

(10) Patent No.: US 12,068,689 B2
(45) Date of Patent: Aug. 20, 2024

(54) POWER CONVERTER DEVICE INCLUDING A PROGRAMMABLE CLOCK SIGNAL CIRCUIT FOR A PLL IN A CONSTANT ON-TIME POWER CONVERTER

(71) Applicant: ANPEC ELECTRONICS CORPORATION, Hsinchu (TW)

(72) Inventors: Jen-Chien Hsieh, Hsinchu (TW); Tsung-Yu Wu, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 236 days.

(21) Appl. No.: 17/833,847

(22) Filed: Jun. 6, 2022

(65) Prior Publication Data

US 2023/0299672 A1    Sep. 21, 2023

(30) Foreign Application Priority Data

Mar. 17, 2022 (TW) ................... 111109729

(51) Int. Cl.
*H02M 3/158* (2006.01)
*H02M 1/00* (2006.01)
(Continued)

(52) U.S. Cl.
CPC ......... *H02M 3/158* (2013.01); *H02M 1/0016* (2021.05); *H02M 1/0022* (2021.05); *H03L 7/0891* (2013.01); *H03L 7/099* (2013.01)

(58) Field of Classification Search
CPC .. H02M 1/0016; H02M 1/0022; H02M 3/158; H02M 3/156; H03L 7/0891; H03L 7/099; H03L 7/093
See application file for complete search history.

(56) References Cited

U.S. PATENT DOCUMENTS

| 2014/0084885 A1* | 3/2014 | Ouyang | ............... | H02M 3/158 323/271 |
| 2014/0160601 A1* | 6/2014 | Ouyang | ............... | H02M 3/158 361/18 |

(Continued)

FOREIGN PATENT DOCUMENTS

| CN | 105226936 A | 1/2016 |
| CN | 105958820 A | 9/2016 |
| TW | I740434 B | 9/2021 |

*Primary Examiner* — Kyle J Moody
*Assistant Examiner* — Jye-June Lee
(74) *Attorney, Agent, or Firm* — Li & Cai Intellectual Property Office (57) ABSTRACT

A power converter device is provided. A feedback circuit outputs a comparison output signal. A phase-locked loop circuit provides a phase-locked signal according to a reference clock signal and an inductor voltage in a power converter circuit. An on-time circuit provides an on-time comparing signal according to the phase-locked signal, an input voltage, the inductor voltage and an output voltage of the power converter circuit. A first input terminal of an SR flip-flop receives the on-time comparing signal from the on-time circuit. A second input terminal of the SR flip-flop receives the comparison output signal from the feedback circuit. A frequency control circuit, according to changes in the input voltage and the output voltage of the power converter circuit, instantaneously adjusts the on-time of the on-time signal such that an output terminal of the SR flip-flop outputs the adjusted on-time signal to the power converter circuit.

10 Claims, 7 Drawing Sheets

(51) Int. Cl.
*H03L 7/089* (2006.01)
*H03L 7/099* (2006.01)

(56) References Cited

U.S. PATENT DOCUMENTS

| | | | |
|---|---|---|---|
| 2015/0280557 A1* | 10/2015 | Xue | H02M 3/156 |
| | | | 323/271 |
| 2015/0362937 A1* | 12/2015 | Wang | H02M 3/156 |
| | | | 323/281 |
| 2016/0105111 A1* | 4/2016 | Yang | H02M 3/156 |
| | | | 323/271 |
| 2017/0133919 A1 | 5/2017 | Li | |
| 2017/0187282 A1* | 6/2017 | Wang | H02M 3/156 |
| 2021/0305899 A1 | 9/2021 | Hsieh et al. | |

\* cited by examiner

POWER CONVERTER DEVICE INCLUDING A PROGRAMMABLE CLOCK SIGNAL CIRCUIT FOR A PLL IN A CONSTANT ON-TIME POWER CONVERTER

CROSS-REFERENCE TO RELATED PATENT APPLICATION

This application claims the benefit of priority to Taiwan Patent Application No. 111109729, filed on Mar. 17, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a power converter device having a constant on-time.

BACKGROUND OF THE DISCLOSURE

A phase-locked loop circuit (PLL) is often configured to precisely synchronize frequencies of constant on-time (COT) related circuits in a power converter. However, in a discontinuous-conduction mode (DCM), a change in frequency of a voltage signal of an inductor can cause the phase-locked loop circuit to be unable to correctly track the frequencies of the COT related circuits.

SUMMARY OF THE DISCLOSURE

In response to the above-referenced technical inadequacies, the present disclosure provides a power converter device having a constant on-time. The power converter device includes a power converter circuit, a feedback circuit and a frequency control circuit. The feedback circuit is connected to the power converter circuit. The feedback circuit is configured to output a comparison output signal. The frequency control circuit is connected to the power converter circuit and the feedback circuit. The frequency control circuit includes a phase-locked loop circuit, an on-time time circuit and an SR flip flop. The phase-locked loop circuit is configured to receive a reference clock signal and an inductor voltage in the power converter circuit. The phase-locked loop circuit is configured to provide a phase-locked signal according to the reference clock signal and inductor voltage. The on-time time circuit is connected to the phase-locked loop circuit. The on-time time circuit is configured to provide an on-time comparing signal according to the input voltage, the output voltage of the power converter circuit, the inductor voltage in the power converter circuit, and the phase-locked signal from the phase-locked loop circuit. The first input terminal of the SR flip flop of the frequency control circuit receives the on-time comparing signal from the on-time time circuit. The second input terminal of the SR flip flop of the frequency control circuit receives the comparison output signal from the feedback circuit. The output terminal of the SR flip flop of the frequency control circuit outputs an on-time signal according to the on-time comparing signal and the comparison output signal. The frequency control circuit instantly adjusts an on-time of the on-time signal according to changes in the input voltage and the output voltage of the power converter circuit. The frequency control circuit instantly outputs the on-time signal adjusted to the power converter circuit.

In certain embodiments, the feedback circuit includes a feedback signal circuit and a comparator. The comparator includes a first input terminal, a second input terminal and an output terminal. One terminal of the feedback signal circuit is connected to the power converter circuit. Another terminal of the feedback signal circuit is connected to the first input terminal of the comparator. The second input terminal of the comparator is connected to a reference voltage.

In certain embodiments, the power converter circuit includes a control circuit, a driver circuit, a high-side switch, a low-side switch, an inductor, a load capacitor and a zero current detector circuit. The control circuit is configured to receive the on-time signal from the frequency control circuit. The driver circuit is connected to the control circuit. The high-side switch includes a first terminal, a second terminal and a third terminal. The first terminal of the high-side switch is connected to an input voltage. The second terminal of the high-side switch is connected to the driver circuit. The low-side switch includes a first terminal, a second terminal and a third terminal. The first terminal of the low-side switch is connected to the third terminal of the high-side switch. The second terminal of the low-side switch is connected to the driver circuit. The third terminal of the low-side switch is connected to a ground voltage. The inductor includes a first terminal and a second terminal. The first terminal of the inductor is connected to the third terminal of the high-side switch and the first terminal of the low-side switch. The second terminal of the inductor is connected to an output terminal of the power converter device. A voltage of the output terminal of the power converter device is the output voltage of the power converter circuit. The inductor voltage is a voltage of a node at which the first terminal of the inductor, the third terminal of the high-side switch and the first terminal of the low-side switch are connected to each other. The load capacitor includes a first terminal and a second terminal. The first terminal of the load capacitor is connected to the second terminal of the inductor. The second terminal of the load capacitor is connected to the ground voltage. The zero current detector circuit includes a first terminal and a second terminal. The first terminal of the zero current detector circuit is connected to the control circuit. The second terminal of the zero current detector circuit is connected to the third terminal of the high-side switch, the first terminal of the low-side switch and the first terminal of the inductor.

In certain embodiments, the frequency control circuit further includes a programmable clock signal circuit. The programmable clock signal circuit is connected to the phase-locked loop circuit. The programmable clock signal circuit is configured to provide a programmable clock signal according to the inductor voltage, the input voltage and the voltage of the output terminal of the power converter device.

In certain embodiments, the phase-locked loop circuit provides the phase-locked signal to the on-time time circuit according to the reference clock signal, the inductor voltage from the power converter circuit and the programmable clock signal from programmable clock signal circuit. The frequency control circuit provides the on-time signal to the power converter circuit according to the reference clock signal, the inductor voltage and the programmable clock signal.

In certain embodiments, the programmable clock signal circuit includes a phase detector circuit, a current pump, an operational circuit, a voltage controlled oscillator and a mode selector circuit. The phase detector circuit is connected to the current pump. The current pump is connected to the operational circuit. The operational circuit is connected to the voltage controlled oscillator. The voltage controlled oscillator is connected to the mode selector circuit. The mode selector circuit provides the programmable clock signal to the phase detector circuit. The phase detector circuit detects phases of the programmable clock signal and the reference clock signal. The current pump outputs a frequency detected voltage to the operational circuit according to the phases detected by the phase detector circuit. The operational circuit transmits the input voltage, the voltage from the output terminal of the power converter device and the frequency detected voltage from the current pump to the voltage controlled oscillator. The voltage controlled oscillator generates a clock signal according to the input voltage, the voltage of the output terminal of the power converter device and the frequency detected voltage.

In certain embodiments, the programmable clock signal includes a first operational amplifier, a first comparator, a second comparator, a third comparator, a first resistor, a first switch, a second switch, a third switch, a fourth switch, a first switching component, a second switching component, a first capacitor, a second capacitor and an SR flip flop. The first operational amplifier includes a first input terminal, a second input terminal and an output terminal. The first comparator includes a first input terminal, a second input terminal and an output terminal. The second comparator includes a first input terminal, a second input terminal and an output terminal. The third comparator includes a first input terminal, a second input terminal and an output terminal. The first resistor includes a first terminal and a second terminal. The first switch includes a first terminal, a second terminal and a third terminal. The second switch includes a first terminal, a second terminal and a third terminal. The third switch includes a first terminal, a second terminal and a third terminal. The fourth switch includes a first terminal, a second terminal and a third terminal. The first switching component includes a first terminal and a second terminal. The second switching component includes a first terminal and a second terminal. The first capacitor includes a first terminal and a second terminal. The second capacitor includes a first terminal and a second terminal. The SR flip flop of the programmable clock signal circuit includes a first input terminal, a second input terminal and an output terminal. The first input terminal of the first operational amplifier receives a voltage difference signal. The second input terminal of the first operational amplifier and the output terminal of the first operational amplifier are connected to the first terminal of the first resistor. The second terminal of the first resistor is connected to the ground voltage. The first terminal of the first switch is connected to the first terminal of the second switch and the first terminal of the third switch. The second terminal of the first switch is connected to the second terminal of the second switch, the third terminal of the first switch and the second terminal of the third switch. The third terminal of the first switch is connected to the output terminal of the first operational amplifier, the second input terminal of the first operational amplifier and the first terminal of the first resistor. The third terminal of the second switch is connected to the first terminal of the second switching component. The second terminal of the second switching component is connected to the first terminal of the first capacitor. The first terminal of the first capacitor receives a current signal through the first switching component. The second terminal of the first capacitor is connected to the ground voltage.

In certain embodiments, the third terminal of the third switch is connected to the first terminal of the second capacitor, the first input terminal of the first comparator and the first terminal of the fourth switch. The second terminal of the second capacitor is connected to the ground voltage. The second terminal of the fourth switch receives a high-side switch signal. The third terminal of the fourth switch is connected to the ground voltage. The second input terminal of the first comparator receives the frequency detected voltage. The first terminal of the first capacitor is connected to the first input terminal of the second comparator and the second input terminal of the third comparator. The second input terminal of the second comparator receives the frequency detected voltage. The first input terminal of the third comparator receives a constant voltage.

In certain embodiments, the output terminal of the second comparator is connected to the first input terminal of the SR flip flop of the programmable clock signal circuit. The output terminal of the third comparator is connected to the second input terminal of the SR flip flop of the programmable clock signal circuit. The output terminal of the of the SR flip flop of the programmable clock signal circuit outputs the programmable clock signal.

In certain embodiments, the first switch, the second switch and the third switch are p-type metal-oxide-semiconductor field effect transistors (MOSFETs). The fourth switch is an n-type metal-oxide-semiconductor field effect transistor.

As described above, the present disclosure provides the power converter device. The power converter device of the present disclosure has a simple and improved circuit design. In a discontinuous-conduction mode, a frequency of the power converter device of the present disclosure can be tracked. In the discontinuous-conduction mode, the on-time of the power converter device of the present disclosure can be adjusted according to changes in the input voltage and the output voltage of the power converter device of the present disclosure. However, the frequency of the power converter device of the present disclosure cannot be adjusted according to a change in a load.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

If any circuit component has more than three pins, the pins of the circuit component are represented by reference numbers that are marked near the pins of the circuit component in the figures of the present disclosure. If any circuit component has two pins, a left terminal or an upper terminal of said circuit component is an input terminal or a first terminal, and a right terminal or a lower terminal of said circuit component is an output terminal or a second terminal.

First Embodiment

Figure 1:
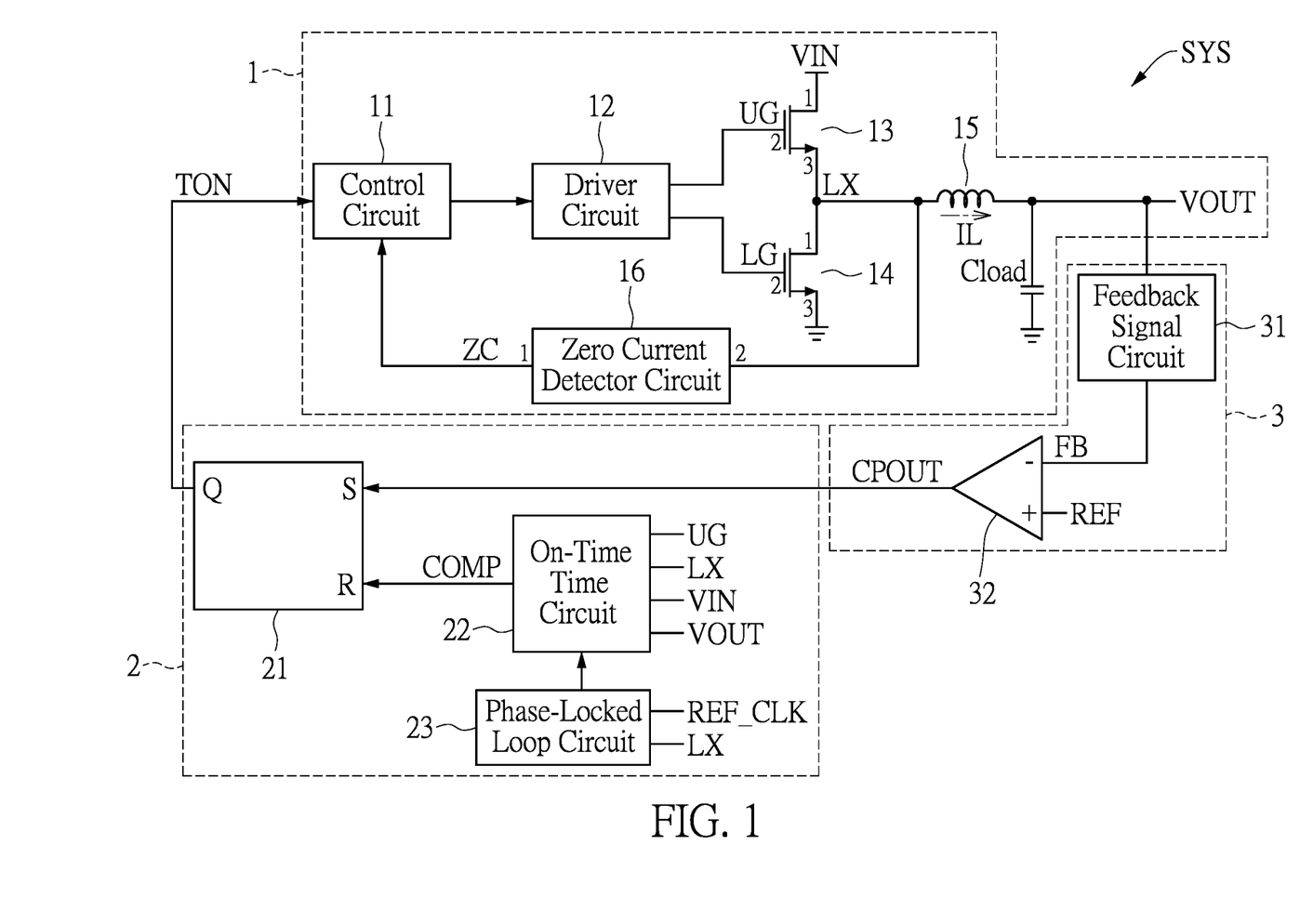
FIG. 1 is a schematic diagram of a power converter device according to a first embodiment of the present disclosure.

Reference is made to FIG. 1, which is a schematic diagram of a power converter device according to a first embodiment of the present disclosure.

In the embodiment, a power converter device SYS having a constant on-time is provided.

The power converter device SYS includes a power converter circuit 1, a frequency control circuit 2 and a feedback circuit 3. The frequency control circuit 2 is connected to the power converter circuit 1. The feedback circuit 3 is connected to the power converter circuit 1 and the frequency control circuit 2.

The frequency control circuit 2 at least receives a reference clock signal REF_CLK and an inductor voltage LX in the power converter circuit 1. The frequency control circuit 2 provides an on-time signal TON according to the reference clock signal REF_CLK and the inductor voltage LX. In addition, the frequency control circuit 2 may receive a comparison output signal CPOUT from the feedback circuit 3. Under this condition, the frequency control circuit 2 provides the on-time signal TON according to the comparison output signal CPOUT, the reference clock signal REF_CLK and the inductor voltage LX in the power converter circuit 1.

In the embodiment, the on-time signal TON has the constant on-time. That is, when the power converter device SYS is switched to a discontinuous-conduction mode (DCM) or a continuous-conduction mode (CCM), the on-time of the power converter device SYS is constant.

In the embodiment, the frequency control circuit 2 includes an SR flip flop 21, an on-time time circuit 22 and a phase-locked loop circuit 23. The phase-locked loop circuit 23 is connected to the on-time time circuit 22. The SR flip flop 21 includes a first input terminal R, a second input terminal S and an output terminal Q. The on-time time circuit 22 is connected to the first input terminal R of the SR flip flop 21. The output terminal Q of the SR flip flop 21 is connected to the power converter circuit 1. The second input terminal S of the SR flip flop 21 is connected to the feedback circuit 3. The feedback circuit 3 includes a feedback signal circuit 31 and a comparator 32. The comparator 32 includes a first input terminal, a second input terminal and an output terminal. One terminal of the feedback signal circuit 31 is connected to the power converter circuit 1. Another terminal of the feedback signal circuit 31 is connected to the first input terminal such as an inverting terminal of the comparator 32. The second input terminal such as a non-inverting terminal of the comparator 32 is connected to a reference voltage REF. The feedback signal circuit 31 provides a feedback signal FB to the first input terminal such as the inverting terminal of the comparator 32.

The power converter circuit 1 includes a control circuit 11, a driver circuit 12, a high-side switch 13, a low-side switch 14, an inductor 15, a zero current detector circuit 16 and a load capacitor Cload.

The control circuit 11 is connected to the SR flip flop 21 of the frequency control circuit 2. The control circuit 11 receives the on-time signal TON from the frequency control circuit 2. The driver circuit 12 is connected to the control circuit 11. The high-side switch 13 includes a first terminal, a second terminal and a third terminal. The first terminal of the high-side switch 13 is connected to an input voltage VIN. The second terminal of the high-side switch 13 is connected to the driver circuit 12. The low-side switch 14 includes a first terminal, a second terminal and a third terminal. The first terminal of the low-side switch 14 is connected to the third terminal of the high-side switch 13. The second terminal of the low-side switch 14 is connected to the driver circuit 12. The third terminal of the low-side switch 14 is connected to a ground voltage. The driver circuit 12 provides a high-side voltage signal UG to the second terminal of the high-side switch 13. The driver circuit 12 provides a low-side voltage signal LG to the second terminal of the low-side switch 14.

The inductor 15 includes a first terminal and a second terminal. The first terminal of the inductor 15 is connected to the third terminal of the high-side switch 13 and the first terminal of the low-side switch 14. The inductor voltage LX is a voltage of a node at which the first terminal of the inductor 15, the third terminal of the high-side switch 13 and the first terminal of the low-side switch 14 are connected to each other. An inductor current IL is a current flowing through the inductor 15.

The load capacitor Cload includes a first terminal and a second terminal. The first terminal of the load capacitor Cload is connected to the second terminal of the inductor 15. The second terminal of the load capacitor Cload is connected to the ground voltage.

The zero current detector circuit 16 includes a first terminal and a second terminal. The first terminal of the zero current detector circuit 16 is connected to the control circuit 11. The second terminal of the zero current detector circuit 16 is connected to the third terminal of the high-side switch 13, the first terminal of the low-side switch 14 and the first terminal of the inductor 15. The zero current detector circuit 16 provides a zero current switching signal ZC to the control circuit 11.

The on-time time circuit 22 receives the high-side voltage signal UG of the second terminal of the high-side switch 13, the inductor voltage LX, the input voltage VIN, and an output voltage VOUT of the power converter device SYS.

Second Embodiment

Figure 2:
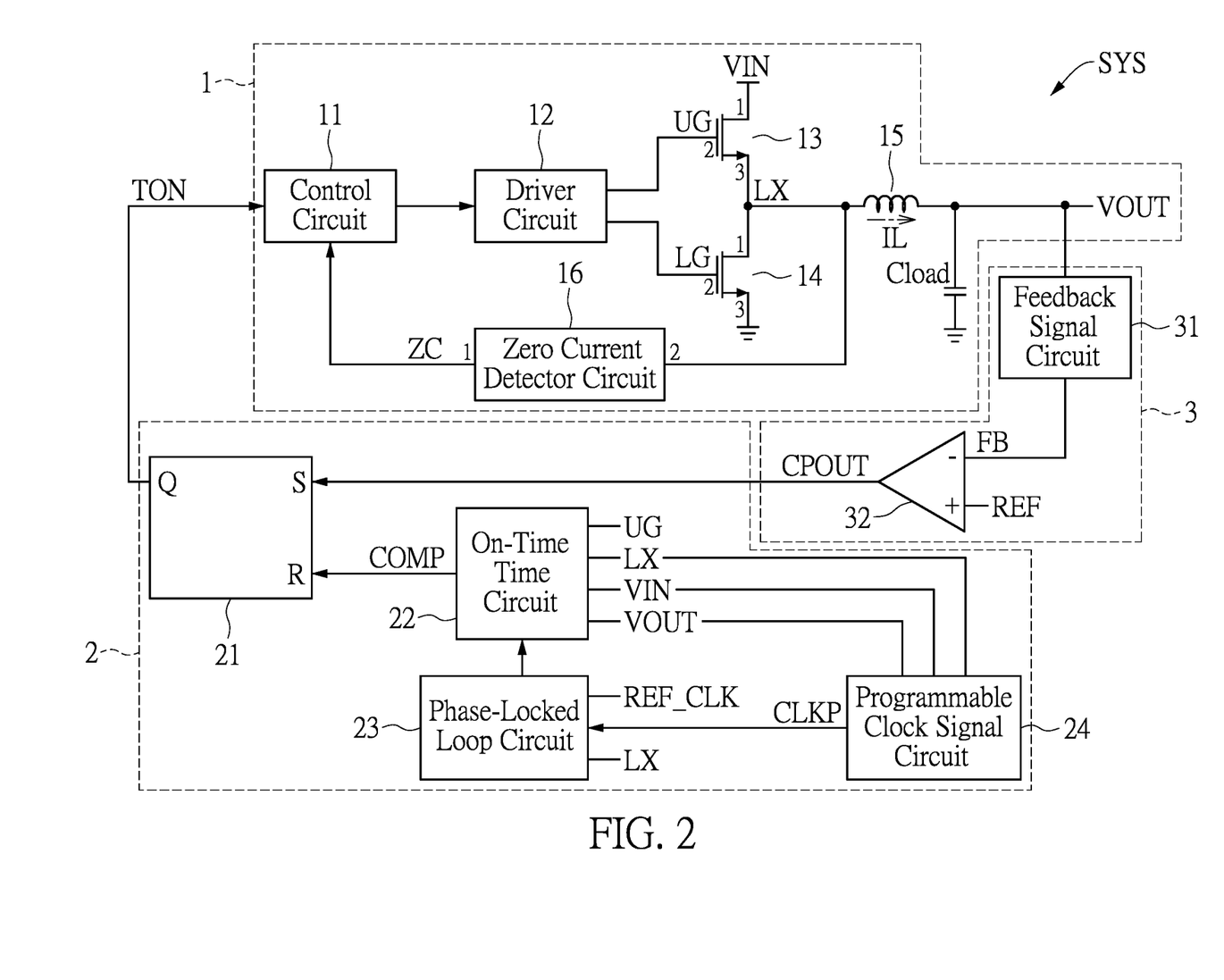
FIG. 2 is a schematic diagram of a power converter device according to a second embodiment of the present disclosure.

Reference is made to FIG. 2, which is a schematic diagram of a power converter device according to a second embodiment of the present disclosure.

The power converter device SYS as shown in FIG. 2 is similar to that shown in FIG. 1, but the power converter device SYS as shown in FIG. 2 further includes a programmable clock signal circuit 24.

The programmable clock signal circuit 24 is connected to the phase-locked loop circuit 23. The programmable clock signal circuit 24 receives the inductor voltage LX, the input voltage VIN and the output voltage VOUT of the power converter device SYS. The programmable clock signal circuit 24 provides a programmable clock signal CLKP according to the inductor voltage LX, the input voltage VIN and the output voltage VOUT.

The programmable clock signal circuit 24 operates and outputs the programmable clock signal CLKP according to the inductor voltage LX, the input voltage VIN and the output voltage VOUT.

The phase-locked loop circuit 23 receives the reference clock signal REF_CLK, the inductor voltage LX and the programmable clock signal CLKP. The phase-locked loop circuit 23 provides a phase-locked signal to the on-time time circuit 22 according to the reference clock signal REF_CLK, the inductor voltage LX and the programmable clock signal CLKP. The on-time time circuit 22 provides an on-time comparing signal COMP to the SR flip flop 21, according to the phase-locked signal, the high-side voltage signal UG of the second terminal of the high-side switch 13, the inductor voltage LX, the input voltage VIN and the output voltage VOUT. Then, the SR flip flop 21 provides the on-time signal TON to the control circuit 11 according to the on-time comparing signal COMP from the on-time time circuit 22 and the comparison output signal CPOUT from the comparator 32 of the feedback circuit 3.

In the embodiment, in the continuous-conduction mode, the on-time of the on-time signal TON may be determined according to the inductor voltage LX and the programmable clock signal CLKP. In the discontinuous-conduction mode, the on-time of the on-time signal TON may be determined according to the programmable clock signal CLKP.

In another embodiment, in the continuous-conduction mode and the discontinuous-conduction mode, the on-time of the on-time signal TON may be determined according to the programmable clock signal CLKP.

In the embodiment, in the discontinuous-conduction mode, the on-time time circuit 22 of the frequency control circuit 2 may detect the input voltage VIN and the output voltage VOUT, and instantly provide the on-time signal TON that is suitable for use at an external frequency according to the input voltage VIN and the output voltage VOUT.

Figure 3:
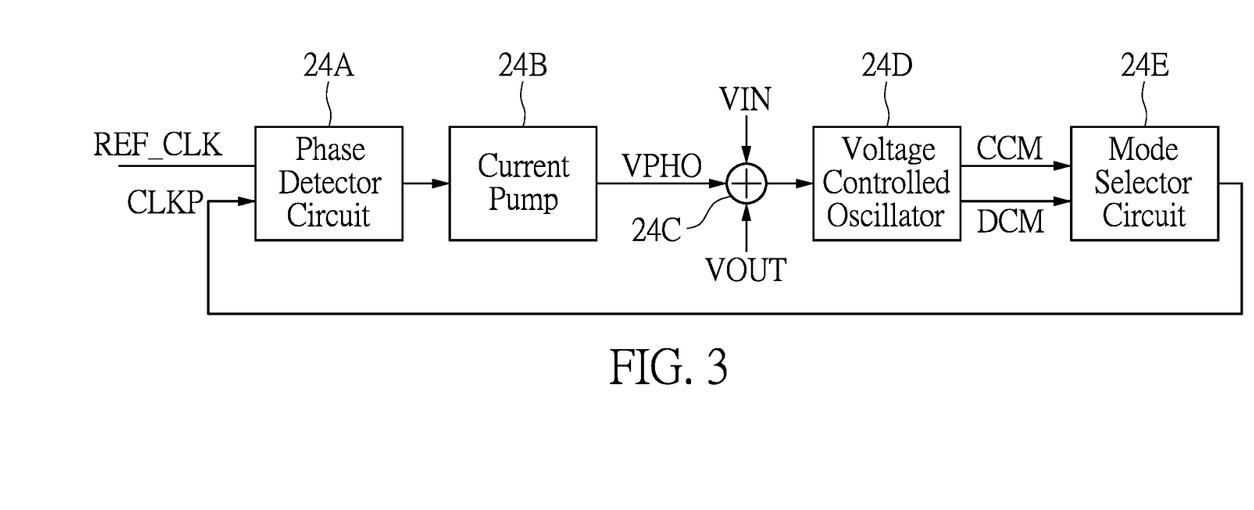
FIG. 3 is a block diagram of a programmable clock signal circuit according to the second embodiment of the present disclosure.

Reference is made to FIG. 3, which is a block diagram of a programmable clock signal circuit according to the second embodiment of the present disclosure.

The programmable clock signal circuit 24 includes a phase detector circuit 24A, a current pump 24B, an operational circuit 24C, a voltage controlled oscillator 24D and a mode selector circuit 24E.

The phase detector circuit 24A is connected to the current pump 24B. The current pump 24B is connected to the operational circuit 24C. The operational circuit 24C is connected to the voltage controlled oscillator 24D. The voltage controlled oscillator 24D is connected to the mode selector circuit 24E. The mode selector circuit 24E provides the programmable clock signal CLKP to the phase detector circuit 24A.

The phase detector circuit 24A detects phases of the programmable clock signal CLKP and the reference clock signal REF_CLK. The current pump 24B outputs a frequency detected voltage VPHO according to the phases detected by the phase detector circuit 24A. When the programmable clock signal CLKP lags behind the reference clock signal REF_CLK, a voltage of the frequency detected voltage VPHO decreases. When the programmable clock signal CLKP leads the reference clock signal REF_CLK, the voltage of the frequency detected voltage VPHO increases.

The frequency detected voltage VPHO is outputted to the operational circuit 24C from the current pump 24B. In addition, the input voltage VIN and the output voltage VOUT are also outputted to the operational circuit 24C. As a result, the voltage controlled oscillator 24D outputs a virtual clock signal to the mode selector circuit 24E according to the frequency detected voltage VPHO, the input voltage VIN and the output voltage VOUT. The virtual clock signal may be a clock signal CCM that is suitable for use in a continuous-conduction mode, or may be a clock signal DCM that is suitable for use in a discontinuous-conduction mode. The mode selector circuit 24E may determine which one of the continuous-conduction mode and the discontinuous-conduction mode is a mode into which the power converter device SYS enters, and provide the programmable clock signal CLKP according to the clock signal CCM or the clock signal DCM.

A duty cycle of the virtual clock signal provided by the voltage controlled oscillator 24D changes with changes in a frequency of the virtual clock signal, the input voltage VIN and the output voltage VOUT.

Figure 4:
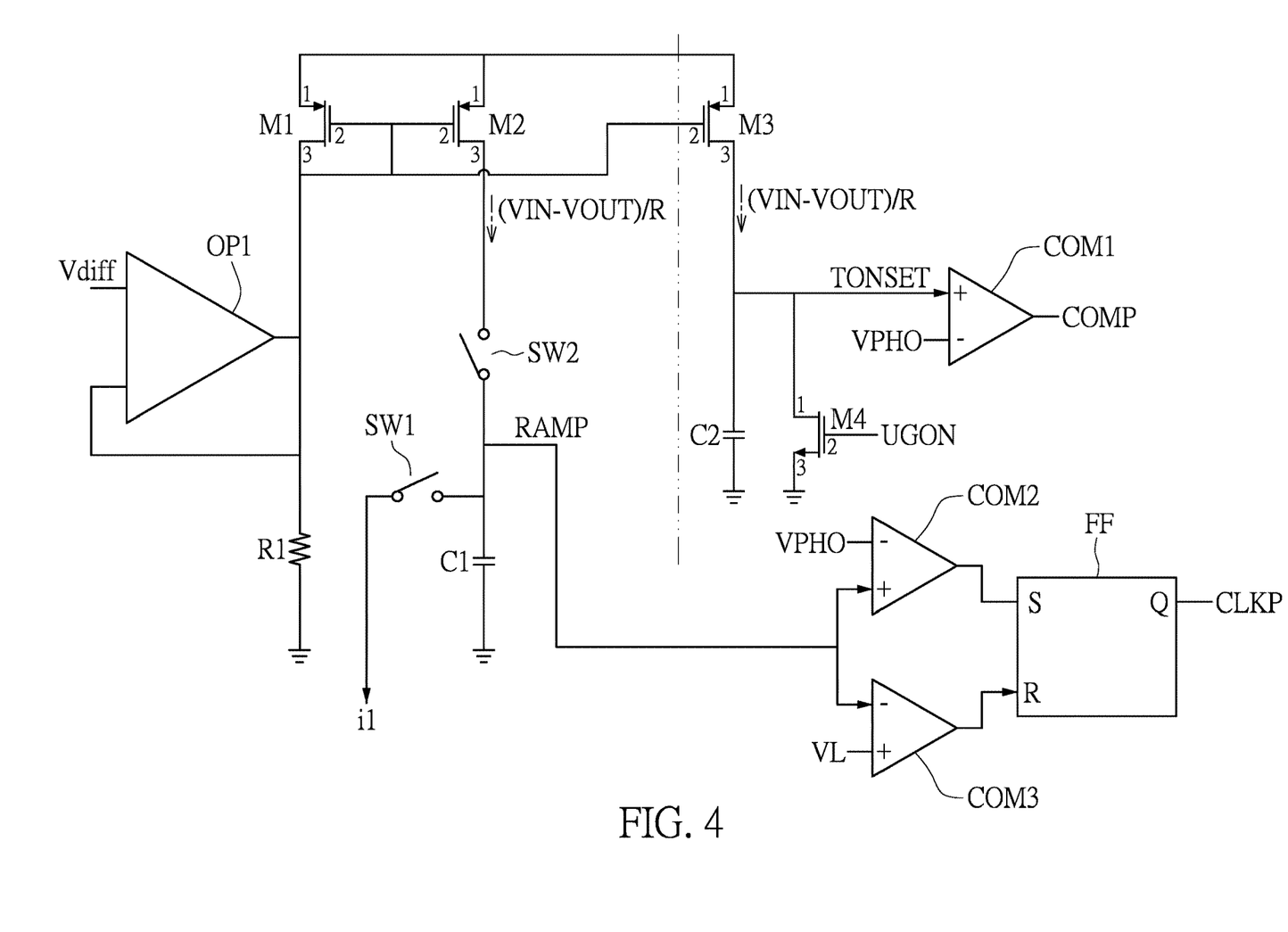
FIG. 4 is a circuit schematic diagram of the programmable clock signal circuit according to the second embodiment of the present disclosure.

Reference is made to FIG. 4, which is a circuit schematic diagram of the programmable clock signal circuit according to the second embodiment of the present disclosure.

The programmable clock signal circuit 24 includes a first operational amplifier OP1, a first comparator COM1, a second comparator COM2, a third comparator COM3, a first resistor R1, a first switch M1, a second switch M2, a third switch M3, a fourth switch M4, a first switching component SW1, a second switching component SW2, a first capacitor C1, a second capacitor C2 and an SR flip flop FF.

The first operational amplifier OP1 includes a first input terminal, a second input terminal and an output terminal. The first comparator COM1 includes a first input terminal, a second input terminal and an output terminal. The second comparator COM2 includes a first input terminal, a second input terminal and an output terminal. The third comparator COM3 includes a first input terminal, a second input terminal and an output terminal. The first resistor R1 includes a first terminal and a second terminal. The first switch M1 includes a first terminal, a second terminal and a third terminal. The second switch M2 includes a first terminal, a second terminal and a third terminal. The third switch M3 includes a first terminal, a second terminal and a third terminal. The fourth switch M4 includes a first terminal, a second terminal and a third terminal. The first switching component SW1 includes a first terminal and a second terminal. The second switching component SW2 includes a first terminal and a second terminal. The first capacitor C1 includes a first terminal and a second terminal. The second capacitor C2 includes a first terminal and a second terminal. The SR flip flop FF includes a first input terminal S, a second input terminal R and an output terminal Q.

The first input terminal of the first operational amplifier OP1 receives a voltage difference signal Vdiff. The second input terminal and the output terminal of the first operational amplifier OP1 are connected to the first terminal of the first resistor R1. The second terminal of the first resistor R1 is connected to the ground voltage.

The first terminal of the first switch M1 is connected to the first terminal of the second switch M2 and the first terminal of the third switch M3.

The second terminal of the first switch M1 is connected to the second terminal of the second switch M2, the third terminal of the first switch M1 and the second terminal of the third switch M3. The third terminal of the first switch M1 is connected to the output terminal of the first operational amplifier OP1, the second input terminal of the first operational amplifier OP1 and the first terminal of the first resistor R1.

The third terminal of the second switch M2 is connected to the first terminal of the second switching component SW2. The second terminal of the second switching component SW2 is connected to the first terminal of the first capacitor C1. The first terminal of the first capacitor C1 receives a current signal i1 through the first switching component SW1. A current value of the current signal i1 is equal to the output voltage VOUT divided by a resistance of the first resistor R1. The second terminal of the first capacitor C1 is connected to the ground voltage.

The third terminal of the third switch M3 is connected to the first terminal of the second capacitor C2, the first input terminal such as a non-inverting terminal of the first comparator COM1 and the first terminal of the fourth switch M4. The first terminal of the second capacitor C2 is connected to the ground voltage. The second terminal of the fourth switch M4 receives a high-side switch signal UGON. The third terminal of the fourth switch M4 is connected to the ground voltage.

The second input terminal such as an inverting terminal of the first comparator COM1 receives the frequency detected voltage VPHO. The first comparator COM1 further includes an output terminal COMP.

The first terminal of the first capacitor C1 is connected to the first input terminal such as a non-inverting terminal of the second comparator COM2 and the second input terminal such as an inverting terminal of the third comparator COM3. The second input terminal such as an inverting terminal of the second comparator COM2 receives the frequency detected voltage VPHO. The first input terminal such as a non-inverting terminal of the third comparator COM3 receives a constant voltage VL.

The output terminal of the second comparator COM2 is connected to the first input terminal S of the SR flip flop FF. The output terminal of the third comparator COM3 is connected to the second input terminal R of the SR flip flop FF. The output terminal Q of the SR flip flop FF outputs the programmable clock signal CLKP.

In the embodiment, a capacitance C of the first capacitor C1 is equal to that of the second capacitor C2. The first resistor R1 has a resistance R.

The first operational amplifier OP1 receives the voltage difference signal Vdiff. The voltage difference signal Vdiff is a voltage difference between the input voltage VIN and the output voltage VOUT. A current flows through the first switch M1 and the first resistor R1 such that a current flowing from the third terminal of the second switch M2 has a current value that is equal to the voltage difference signal Vdiff divided by the resistance R of the first resistor R1, which is calculated by the following equation: (VIN−VOUT)/R. The current charges the first capacitor C1 and is discharged from the first capacitor C1 such that a ramp signal RAMP is provided to the second comparator COM2 and the third comparator COM3.

The first switch M1, the second switch M2 and the third switch M3 are disposed in a current mirror circuit. The current value of the current flowing through the third switch M3 is equal to the current value of the current flowing from the third terminal of the second switch M2. That is, the current value of the current flowing through the third switch M3 is also calculated by the following equation: (VIN−VOUT)/R. In addition, the third switch M3 provides an on-time setting signal TONSET to the first input terminal such as the non-inverting terminal of the first comparator COM1.

The first switch M1, the second switch M2 and the third switch M3 are p-type metal-oxide-semiconductor field effect transistors (MOSFETs), and the fourth switch M4 is an n-type metal-oxide-semiconductor field effect transistor.

Parameters of the programmable clock signal circuit of FIG. 4 are calculated in the following manners.

A frequency of the programmable clock signal circuit of the power converter device is represented by FSW and calculated by the following equation: FSW=(VOUT/VIN)/TON.

A minimum on-time is represented by Tonmin and calculated by the following equation: Tonmin=VL×C/((VIN−VOUT)/R).

A maximum on-time is represented by Tonmax and calculated by the following equation: Tonmax=VPHO_max×C/((VIN−VOUT)/R).

Figure 5:
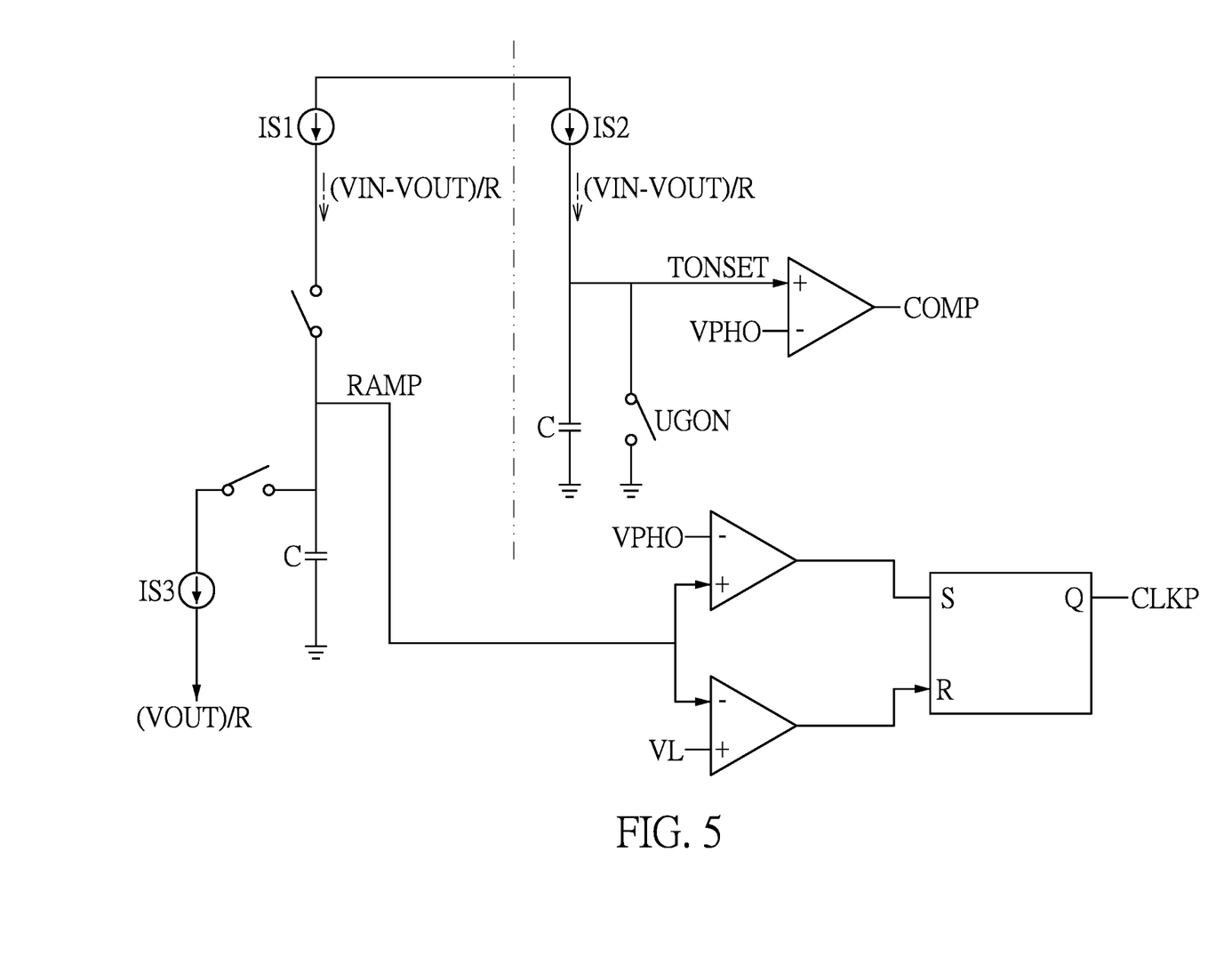
FIG. 5 is a conceptual circuit diagram of the programmable clock signal circuit according to the second embodiment of the present disclosure.
Figure 6:
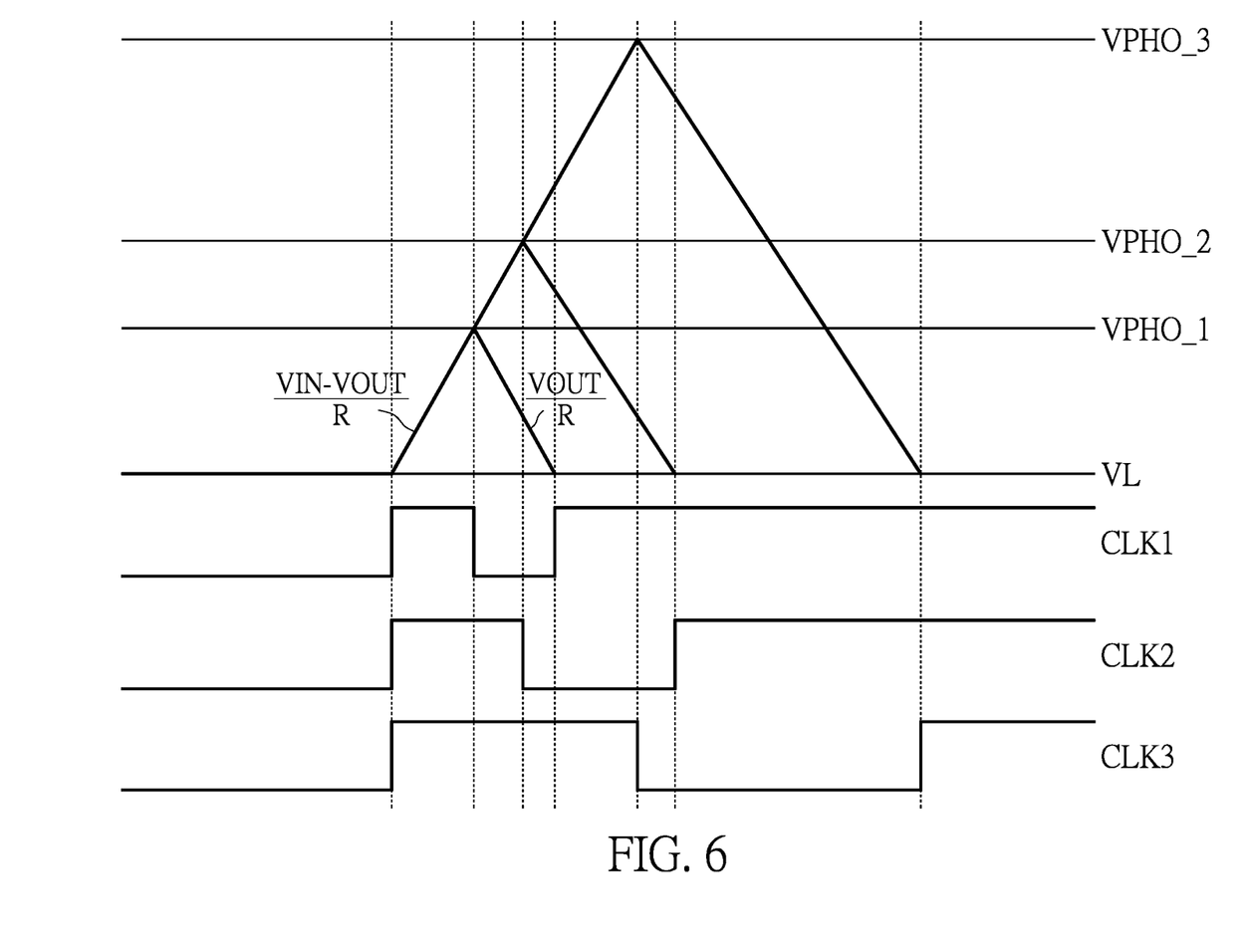
FIG. 6 is a waveform diagram of signals of the power converter device according to the second embodiment of the present disclosure.

Reference is made to FIGS. 5 and 6, in which FIG. 5 is a conceptual circuit diagram of the programmable clock signal circuit according to the second embodiment of the present disclosure, and FIG. 6 is a waveform diagram of signals of the power converter device according to the second embodiment of the present disclosure.

As shown in FIG. 6, the on-time signal TON may be calculated according to the input voltage VIN, the output voltage VOUT, the constant voltage VL and the frequency detected voltage VPHO as the following equation:

$$TON=(((VIN-VOUT)/R)/C) \times D = -(((-VOUT)/R)/C) \times (1-D).$$

As shown in FIG. 5, a rising slope of the ramp signal RAMP is calculated by the following equation: ((VIN−VOUT)/R)/C. If C is a constant value, the rising slope of the ramp signal RAMP is proportional to a value calculated by the following equation: (VIN−VOUT)/R. A falling slope of the ramp signal RAMP is calculated by the following equation: (VOUT/R)/C. If C is the constant value, the falling slope of the ramp signal RAMP is proportional to a value calculated by the following equation: VOUT/R.

The above-mentioned duty cycle D of the on-time signal TON may be calculated by the following equation: D=VOUT/VIN.

The frequency of the virtual clock signal may be adjusted according to the frequency detected voltage VPHO as shown in FIG. 5 (or frequency detected voltages VPHO_1, VPHO_2, VPHO_3 as shown in FIG. 6), and a capacitance of the first capacitor C1 or the resistance of the first resistor R1. In the embodiment, the capacitance of the first capacitor C1 and the resistance of the first resistor R1 may be adjusted according to actual requirements, and the present disclosure is not limited thereto. In other embodiments, the circuit of the power converter device may be designed according to different parameters, but the present disclosure is not limited thereto.

The circuit of the power converter device may be designed according to the input voltage VIN and the output voltage VOUT as shown in FIG. 4.

As shown in FIG. 5, current sources IS1, IS2, IS3 and other circuit components are configured in the power converter device such that the frequency detected voltage VPHO is generated according to the input voltage VIN and the output voltage VOUT. As shown in FIGS. 4 and 5, the first resistor R1, a capacitor C and other related circuits are matched with the current sources IS1, IS2, IS3. The resistance R of the first resistor R1, the capacitance of the capacitor C and data of the other related circuits may be adjusted according to actual requirements.

As shown in FIGS. 5 and 6, a waveform of a first clock signal CLK1 may be generated according to the frequency detected voltages VPHO_1, the constant voltage VL and the ramp signal RAMP. A waveform of a second clock signal CLK2 may be generated according to the frequency detected voltages VPHO_2, the constant voltage VL and the ramp signal RAMP. A waveform of a third clock signal CLK3 may be generated according to the frequency detected voltages VPHO_3, the constant voltage VL and the ramp signal RAMP.

Figure 7:
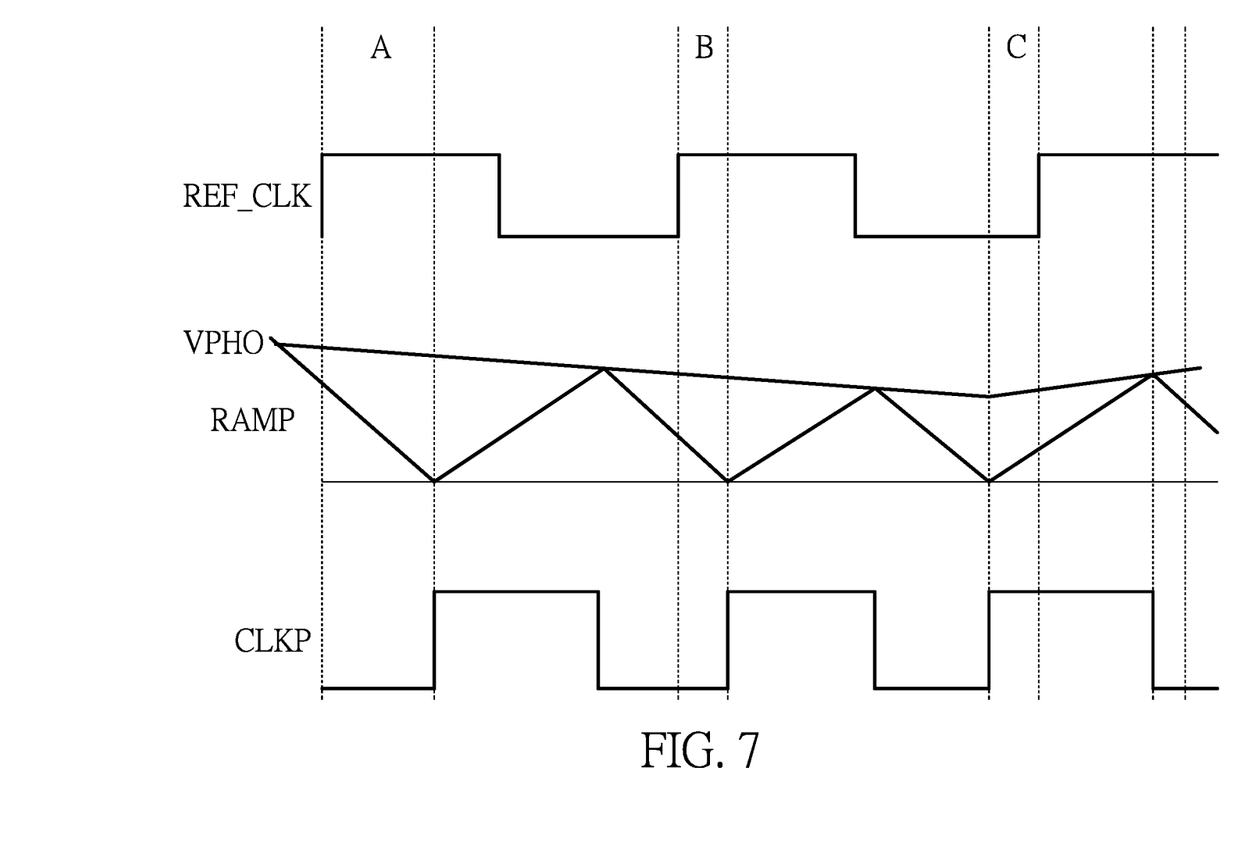
FIG. 7 is a waveform diagram of signals of the power converter device according to the second embodiment of the present disclosure.

Reference is made to FIG. 7, which is a waveform diagram of signals of the power converter device according to the second embodiment of the present disclosure.

As shown in FIG. 7, when the slope and a duty cycle of the ramp signal RAMP does not change over time, the frequency detected voltage VPHO may be decreased such that the frequency of the programmable clock signal CLKP is increased.

The reference clock signal REF_CLK has a constant frequency. As shown in FIG. 7, the phase of the programmable clock signal CLKP lags behind the reference clock signal REF_CLK in regions A and B. The phase of the programmable clock signal CLKP leads the reference clock signal REF_CLK in a region C.

When the voltage of the frequency detected voltage VPHO is decreased and rising and falling slopes of the ramp signal RAMP are the same, the frequency of the programmable clock signal CLKP may be gradually increased.

In conclusion, the present disclosure provides the power converter device. The power converter device of the present disclosure has a simple and improved circuit design. In the discontinuous-conduction mode, the frequency of the power converter device of the present disclosure can be tracked. In the discontinuous-conduction mode, the on-time of the power converter device of the present disclosure can be adjusted according to changes in the input voltage and the output voltage of the power converter device of the present disclosure. However, the frequency of the power converter device of the present disclosure cannot be adjusted according to a change in a load.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter device having a constant on-time, comprising:
   a power converter circuit;
   a feedback circuit connected to the power converter circuit and configured to output a comparison output signal; and
   a frequency control circuit connected to the power converter circuit and the feedback circuit, wherein the frequency control circuit includes:
   a phase-locked loop circuit configured to receive a reference clock signal and an inductor voltage in the power converter circuit, and configured to provide a phase-locked signal according to the reference clock signal and the inductor voltage;
   an on-time time circuit connected to the phase-locked loop circuit, wherein the on-time time circuit is configured to provide an on-time comparing signal according to an input voltage and an output voltage of the power converter circuit, the inductor voltage in the power converter circuit, and the phase-locked signal from the phase-locked loop circuit; and
   an SR flip flop including a first input terminal, a second input terminal and an output terminal, wherein the first input terminal of the SR flip flop of the frequency control circuit receives the on-time comparing signal from the on-time time circuit, the second input terminal of the SR flip flop of the frequency control circuit receives the comparison output signal from the feedback circuit, and the output terminal of the SR flip flop of the frequency control circuit outputs an on-time signal according to the on-time comparing signal and the comparison output signal;
   wherein the frequency control circuit instantaneously adjusts an on-time of the on-time signal according to changes in the input voltage and the output voltage of the power converter circuit, and outputs the on-time signal that is adjusted to the power converter circuit.

2. The power converter device according claim 1, wherein the feedback circuit includes a feedback signal circuit and a comparator, the comparator includes a first input terminal, a second input terminal and an output terminal, one terminal of the feedback signal circuit is connected to the power converter circuit, another terminal of the feedback signal circuit is connected to the first input terminal of the comparator, and the second input terminal of the comparator is connected to a reference voltage.

3. The power converter device according claim 2, wherein the power converter circuit includes:
   a control circuit configured to receive the on-time signal from the SR flip flop;
   a driver circuit connected to the control circuit;
   a high-side switch including a first terminal, a second terminal and a third terminal, wherein the first terminal of the high-side switch is connected to the input voltage, and the second terminal of the high-side switch is connected to the driver circuit;
   a low-side switch including a first terminal, a second terminal and a third terminal, wherein the first terminal of the low-side switch is connected to the third terminal of the high-side switch, the second terminal of the low-side switch is connected to the driver circuit, and the third terminal of the low-side switch is connected to a ground voltage;
   an inductor including a first terminal and a second terminal, wherein the first terminal of the inductor is connected to the third terminal of the high-side switch and the first terminal of the low-side switch, the second terminal of the inductor is an output terminal of the power converter device, a voltage of the output terminal of the power converter device is the output voltage of the power converter circuit, and the inductor voltage is a voltage of a node at which the first terminal of the inductor, the third terminal of the high-side switch and the first terminal of the low-side switch are connected to each other;
   a load capacitor including a first terminal and a second terminal, wherein the first terminal of the load capacitor is connected to the second terminal of the inductor, and the second terminal of the load capacitor is connected to the ground voltage; and
   a zero current detector circuit including a first terminal and a second terminal, wherein the first terminal of the zero current detector circuit is connected to the control circuit, and the second terminal of the zero current detector circuit is connected to the third terminal of the high-side switch, the first terminal of the low-side switch and the first terminal of the inductor.

4. The power converter device according claim 3, wherein the frequency control circuit further includes:
   a programmable clock signal circuit connected to the phase-locked loop circuit, and configured to provide a programmable clock signal according to the inductor voltage, the input voltage and the voltage of the output terminal of the power converter device.

5. The power converter device according claim 4, wherein the phase-locked loop circuit provides the phase-locked signal to the on-time time circuit according to the reference clock signal, the inductor voltage from the power converter circuit and the programmable clock signal from programmable clock signal circuit, and the frequency control circuit provides the on-time signal to the power converter circuit according to the reference clock signal, the inductor voltage and the programmable clock signal.

6. The power converter device according claim 5, wherein the programmable clock signal circuit includes a phase detector circuit, a current pump, an operational circuit, a voltage controlled oscillator and a mode selector circuit;
   wherein the phase detector circuit is connected to the current pump, the current pump is connected to the operational circuit, the operational circuit is connected to the voltage controlled oscillator, the voltage controlled oscillator is connected to the mode selector circuit, and the mode selector circuit provides the programmable clock signal to the phase detector circuit;
   wherein the phase detector circuit detects phases of the programmable clock signal and the reference clock signal, and the current pump outputs a frequency detected voltage to the operational circuit according to the phases detected by the phase detector circuit;
   wherein the operational circuit transmits the input voltage, the voltage from the output terminal of the power converter device and the frequency detected voltage from the current pump to the voltage controlled oscillator;
   wherein the voltage controlled oscillator generates a clock signal according to the input voltage, the voltage of the output terminal of the power converter device and the frequency detected voltage.

7. The power converter device according claim 5, wherein the programmable clock signal circuit includes a first operational amplifier, a first comparator, a second comparator, a third comparator, a first resistor, a first switch, a second switch, a third switch, a fourth switch, a first switching component, a second switching component, a first capacitor, a second capacitor and an SR flip flop;
   wherein the first operational amplifier includes a first input terminal, a second input terminal and an output terminal, the first comparator includes a first input terminal, a second input terminal and an output terminal, the second comparator includes a first input terminal, a second input terminal and an output terminal, the third comparator includes a first input terminal, a second input terminal and an output terminal, the first resistor includes a first terminal and a second terminal, the first switch includes a first terminal, a second terminal and a third terminal, the second switch includes a first terminal, a second terminal and a third terminal, the third switch includes a first terminal, a second terminal and a third terminal, the fourth switch includes a first terminal, a second terminal and a third terminal, the first switching component includes a first terminal and a second terminal, the second switching component includes a first terminal and a second terminal, the first capacitor includes a first terminal and a second terminal, the second capacitor includes a first terminal and a second terminal, and the SR flip flop of the programmable clock signal circuit includes a first input terminal, a second input terminal and an output terminal;
   wherein the first input terminal of the first operational amplifier receives a voltage difference signal, the second input terminal of the first operational amplifier and the output terminal of the first operational amplifier are connected to the first terminal of the first resistor, the second terminal of the first resistor is connected to the ground voltage, the first terminal of the first switch is connected to the first terminal of the second switch and the first terminal of the third switch, the second terminal of the first switch is connected to the second terminal of the second switch, the third terminal of the first switch and the second terminal of the third switch, the third terminal of the first switch is connected to the output terminal of the first operational amplifier, the second input terminal of the first operational amplifier and the first terminal of the first resistor, the third terminal of the second switch is connected to the first terminal of the second switching component, the second terminal of the second switching component is connected to the first terminal of the first capacitor, the first terminal of the first capacitor receives a current signal through the first switching component, and the second terminal of the first capacitor is connected to the ground voltage.

8. The power converter device according claim 7, wherein the third terminal of the third switch is connected to the first terminal of the second capacitor, the first input terminal of the first comparator and the first terminal of the fourth switch, the second terminal of the second capacitor is connected to the ground voltage, the second terminal of the fourth switch receives a high-side switch signal, the third terminal of the fourth switch is connected to the ground voltage, the second input terminal of the first comparator receives the frequency detected voltage, the first terminal of the first capacitor is connected to the first input terminal of the second comparator and the second input terminal of the third comparator, the second input terminal of the second comparator receives the frequency detected voltage, and the first input terminal of the third comparator receives a constant voltage.

9. The power converter device according claim 8, wherein the output terminal of the second comparator is connected to the first input terminal of the SR flip flop of the programmable clock signal circuit, the output terminal of the third comparator is connected to the second input terminal of the SR flip flop of the programmable clock signal circuit, and the output terminal of the of the SR flip flop of the programmable clock signal circuit outputs the programmable clock signal.

10. The power converter device according claim 9, wherein the first switch, the second switch and the third switch are p-type metal-oxide-semiconductor field effect transistors (MOSFETs), and the fourth switch is an n-type metal-oxide-semiconductor field effect transistor.

* * * * *